United States Patent
Chen et al.

(10) Patent No.: US 6,521,138 B2
(45) Date of Patent: Feb. 18, 2003

(54) METHOD FOR MEASURING WIDTH OF BOTTOM UNDER CUT DURING ETCHING PROCESS

(75) Inventors: Hung-Chieh Chen, KaoHsiung (TW); Chun-Yen Chen, Mao-Li Hsien (TW)

(73) Assignee: Silicon Integrated Systems Corporation, Hsinchu (TW)

( * ) Notice: Subject to any disclaimer, the term of this patent is extended or adjusted under 35 U.S.C. 154(b) by 60 days.

(21) Appl. No.: 09/873,157

(22) Filed: Jun. 1, 2001

(65) Prior Publication Data

US 2002/0179568 A1 Dec. 5, 2002

(51) Int. Cl.[7] ............................................. H01L 21/66
(52) U.S. Cl. ....................... 216/59; 216/84; 264/406; 438/14; 438/696
(58) Field of Search ................................. 216/46, 57, 59, 216/84; 438/14, 696; 264/406

(56) References Cited

U.S. PATENT DOCUMENTS

| | | | | |
|---|---|---|---|---|
| 4,319,955 A | * | 3/1982 | Murski | 216/107 |
| 4,613,402 A | * | 9/1986 | Losee et al. | 257/217 |
| 4,717,445 A | * | 1/1988 | Leung | 438/16 |
| 5,298,117 A | * | 3/1994 | Hanson et al. | 216/107 |
| 5,573,624 A | | 11/1996 | Barbee et al. | 156/345 |
| 5,788,801 A | | 8/1998 | Barbee et al. | 156/345 |
| 6,030,903 A | * | 2/2000 | Glogovsky | 438/738 |

FOREIGN PATENT DOCUMENTS

| | | | | |
|---|---|---|---|---|
| JP | 02234474 A | * | 9/1990 | H01L/29/804 |
| WO | WO 200017095 A1 | * | 3/2000 | B81C/1/00 |

* cited by examiner

Primary Examiner—Allan Olsen

(57) ABSTRACT

A method of measuring the width of bottom under cut includes forming spacers around an oxide line pattern and determining the width of the tail ends of the spacers that are removed along with the bottom under cut. An oxide line pattern is first formed on a substrate and a deposition layer is then deposited thereon. The deposition layer is etched to form a deposition pattern by using a photoresist pattern as a mask. A spacer is also formed against each side wall of the oxide line pattern as a result of the etching process. The etching is continued to under cut the deposition pattern and remove the tail ends of the spacers. By measuring the width of the photoresist pattern, the width of the spacer before and after the tail end is removed during each respective step, the width of the bottom under cut can be determined.

2 Claims, 2 Drawing Sheets

(A)

(B)

METHOD FOR MEASURING WIDTH OF BOTTOM UNDER CUT DURING ETCHING PROCESS

FIELD OF THE INVENTION

The present invention generally relates to a method for monitoring the etching condition of a chemical etching process, and more specifically to a real-time in-situ method for measuring the width of bottom under cut.

BACKGROUND OF THE INVENTION

Film etching is an important micro lithographic technique that uses a photoresist pattern as a mask for film patterning in semiconductor device fabrication. In general, etching techniques can be categorized as wet etching and dry etching. Wet etching relies on acid or alkali etching solution to etch away film material. Because an etching solution also etches away the film material from the two edges under the photoresist pattern, wet etching is isotropic. The width of the etched pattern on the bottom is smaller than that of the pattern designed with photoresist. The phenomenon of bottom under cut is very pronounced in wet etching.

Dry etching usually involves plasmas and is anisotropic. A plasma can be considered as an ionized gas consisting of positive and negative ions, electrons, neutrals, atoms, molecules, clusters, etc. Plasma etching relies on the fact that with the right chemistry, surface atoms can be turned into gas phase molecules which can then be pumped away. A glow discharge plasma (usually RF) is used to generate reactive species, e.g. atoms, radicals and ions, from parent gases for plasma etching.

Anisotropic etching can be achieved by means of appropriate etching condition and vertically injected ions. The size and dimension of the etched patterns can be close to the photoresist mask patterns. In practice, however, different materials may be etched away near the edge of the photoresist patterns by the neutralized particles. In addition, the ions in the plasma may be scattered by the grid electrodes while they are directed towards the wafer substrate. The charge on the substrate surface also changes the incident angles of the ions. Therefore, the side walls of the etched pattern also react with the ions to result in bottom under cut.

In order to fabricate semiconductor devices having fine patterns and features in the sub-micron range, different methods and apparatus have been presented to improve the fabrication process and to control the bottom under cut in the etched patterns. A popular technique used in developing new process technology is to vary the parameters of plasma etching. From the etching results such as etched rate and shape, the effect of varying the parameters can be estimated and determined. The information is then fed back to the parameters to iteratively achieve the desired process. U.S. Pat. No. 5,573,624 and U.S. Pat. No. 5,788,801 granted to Barbee et al. that disclose a contactless method and apparatus for real-time in-situ monitoring of a chemical etching process during etching are examples in the art.

The conventional technique by varying parameters used for plasma etching can not determine how much the line width or critical dimension has been different from the designed or expected value. In addition, it is not possible to monitor and determine the bottom under cut in real time invasively with current technology of critical dimension measurement when bottom under cut is necessary. There exists a strong demand in having an invasive and real time technology that can monitor and measure the width of bottom under cut during the etching process of semiconductor device manufacturing.

SUMMARY OF THE INVENTION

This invention has been made to overcome the above-mentioned deficiency in determining the bottom under cut in the conventional technology. The primary object of the invention is to provide a method for measuring the width of bottom under cut during the etching process while manufacturing the semiconductor device. Another object is to provide a method for measuring the width without having to damage the manufactured semiconductor device.

Accordingly, an oxide line pattern is first formed on a substrate and the width of the line pattern is measured. A deposition layer is then deposited above the oxide line pattern and the substrate. A photoresist pattern is formed by a micro-lithographic technique above the deposition layer. The width of the photoresist pattern is measured. The deposition layer is then etched to form a deposition pattern by using the photoresist pattern as a mask.

The residual deposition layer after the etching process forms a spacer against each side wall of the oxide line pattern. The width of the spacer can be measured. The etching is continued to under cut the deposition pattern and remove the tail ends of the spacers. The width of the spacer is measured again after the tail end is removed. From the width of the photoresist pattern, the width of the spacer before and after the tail end is removed, the width of the bottom under cut can be determined.

DETAILED DESCRIPTION OF THE PREFERRED EMBODIMENTS

Figure 1:
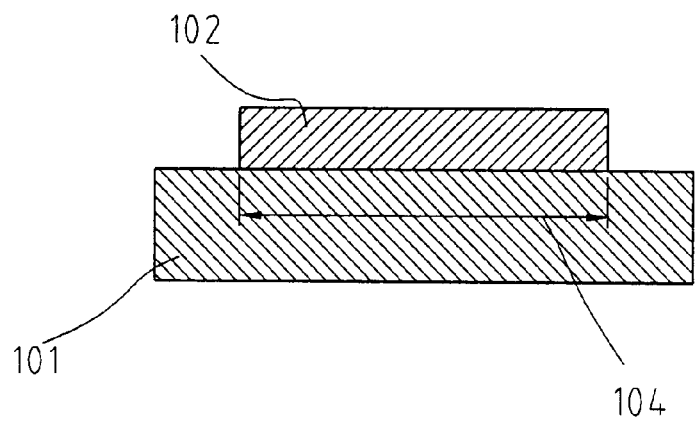
FIG. 1(A) shows the cross-sectional view of the gate of a MOS transistor in the ideal condition.
FIG. 1(B) shows the cross-sectional view of the gate of a MOS transistor in practice.
Figure 1:
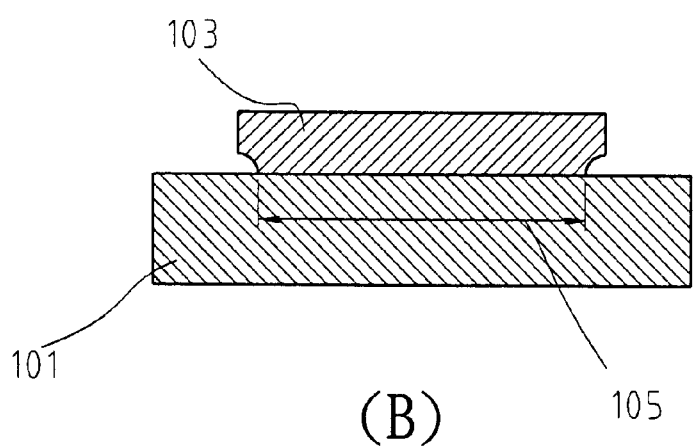

With reference to FIG. 1(A), the cross-sectional view of an ideal gate 102 of a MOS transistor is illustrated. As can be seen, it is ideal to have uniform line width from the top to the bottom of the gate 102. The ideal channel width 104 depends on the width at the interface between the gate 102 and the substrate 101 is illustrated in FIG. 1(A). In practice, the gate of a MOS manufactured for a semiconductor device is shown in FIG. 1(B). Because of the bottom under cut, the channel width 105 formed by the etched gate 103 and the substrate 101 is smaller than the ideal channel width 104.

Figure 2:
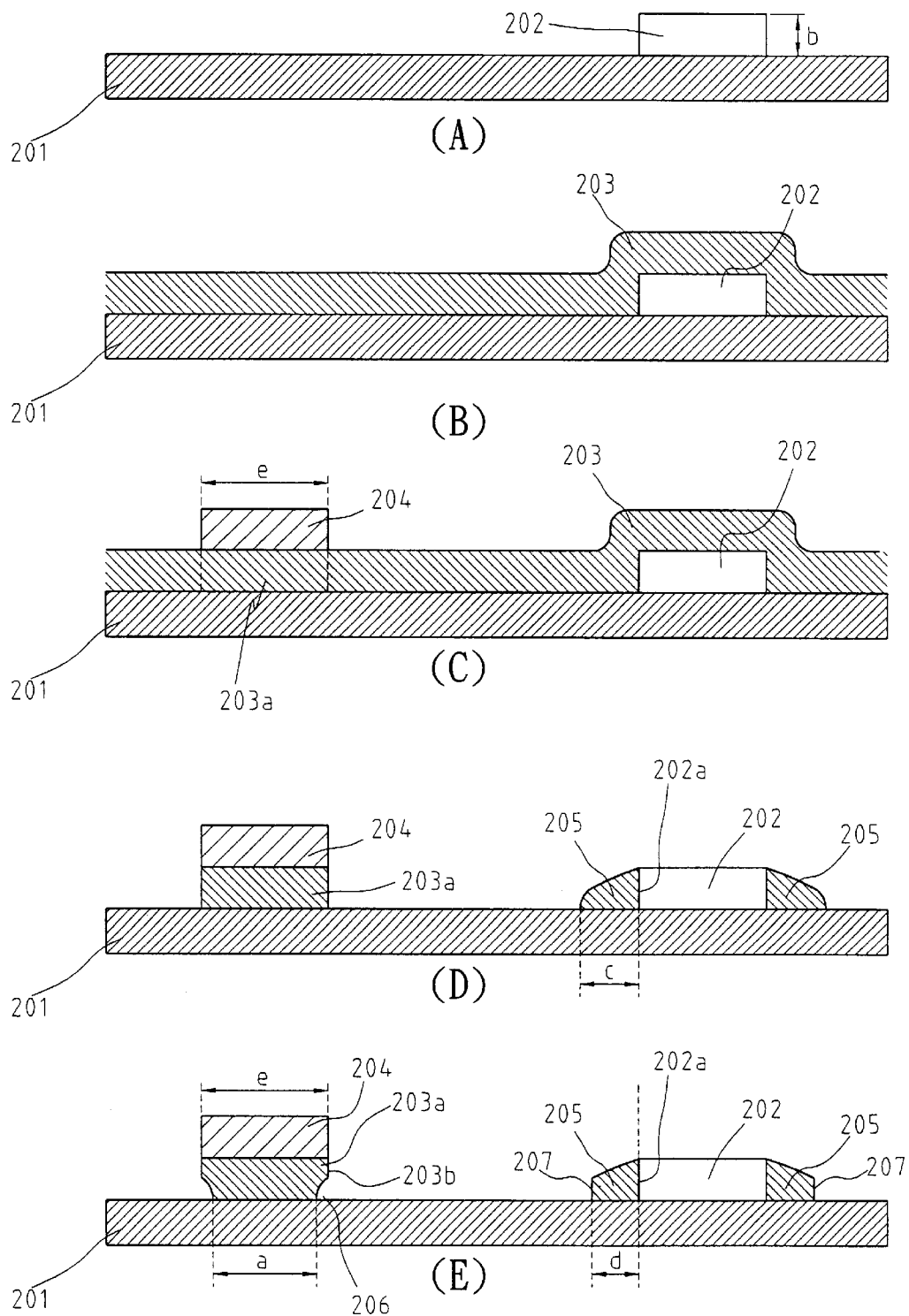
FIG. 2 illustrates the steps of the method according to the present invention including (A) the step of forming an oxide line pattern, (B) the step of deposition, (C) the step of micro-lithography, (D) the major etching step, and (E) the bottom under cut step.

FIGS. 2(A)–2(E) illustrates the steps of the method of determining the bottom under cut according to the present invention. An oxide line pattern 202 is first formed on a substrate 201 by depositing an SiO2 layer above the substrate using LPTEOS deposition followed by micro-lithographic etching as shown in FIG. 2(A). The thickness b of the oxide line pattern is controlled and measured. A deposition layer 203 is then formed above the oxide line pattern 202 and the substrate 201 as shown in FIG. 2(B). The material of the deposition layer 203 depends on the type of the line pattern to be formed for the semiconductor device. According to one embodiment of the invention, the deposition layer 203 is a poly-silicon layer formed by LPCVD method.

According to the invention, micro-lithographic technology is then used to form a photoresist pattern 204 above the desired deposition pattern 203a as shown in FIG. 2(C). The photoresist pattern 204 is used as a mask for the following etching process. As can be seen, the photoresist pattern 204 is formed above the polysilicon layer. The width c of the photoresist pattern 204 is measured.

The deposition layer 203 is etched to form the deposition pattern 203a by using the photoresist pattern 204 as a mask as illustrated in FIG. 2(D). The etching process also results in polysilicon spacers 205 against the side walls 202a of the oxide line pattern 202. The width of a spacer 205 can be measured as c. The etching process continues to under cut the deposition pattern 203a and etch away the tail end of the spacer 205. As shown in FIG. 2(E), a sharp side wall 207 is formed for the spacer 205. The width of the remaining spacer 205 is then measured as d.

According to this invention, the width c of the polysilicon spacer 205 is a fixed value if the parameters used in the etching process are fixed. The only parameter that may affect the shape of the spacer 205 is the thickness b of the oxide line pattern 202. By adjusting the thickness b of the oxide line pattern 202, the shape of the bottom under cut 206 can be controlled to be almost identical to that of the tail end of the spacer 205. Hence, it can be expected that the width of bottom under cut 206 on the side wall 203b below the photoresist pattern 204 is about the size of the tail end that is etched away from the spacer 205. Scanning electron microscope is usually used to confirm and finalize the thickness b which can result in identical shapes of the bottom under cut 206 and the tail end of the spacer 205 by having split runs with different conditions.

Therefore, from the above measurements c, d and e, the width a at the interface between the etched deposition pattern 203a and the substrate 201 can be determined by the relationship $$e-a=2(c-d)$$

which gives the width $$a=e-2(c-d).$$

Although only the preferred embodiments of this invention were shown and described in the above description, numerous changes in the detailed construction and combination as well as arrangement of parts may be restored to without departing from the spirit or scope of the invention as hereinafter set forth in the appended claims. It is requested that any modification or combination that comes within the spirit of this invention be protected.

What is claimed is:

1. A method of determining the width of bottom under cut, comprising:

forming an oxide line pattern above a substrate, controlling and measuring the thickness b of said oxide line pattern;

depositing a deposition layer above said oxide line pattern and said substrate;

forming a photoresist pattern above said deposition layer;

etching said deposition layer to form a deposition pattern by using said photoresist pattern as a mask and leave a spacer on each side wall of said oxide line pattern, and measuring the width c of said spacer and the top width e of said deposition pattern;

continuing etching to under cut said deposition pattern and remove a tail end of each spacer, and measuring the width d of said spacer after said tail end is removed; and determining the width of bottom under cut of said deposition pattern by computing the value of $e-2(c-d)$.

2. A method of determining the width of bottom under cut, comprising:

forming an oxide line pattern above a substrate by using an LPTEOS method, controlling and measuring the thickness b of said oxide line pattern;

depositing a polysilicon layer above said oxide line pattern and said substrate by using an LPCVD method;

forming a photoresist pattern above said polysilicon layer by micro-lithographic process;

etching said polysilicon layer to form a polysilicon pattern by using said photoresist pattern as a mask and leave a spacer on each side wall of said oxide line pattern, and measuring the width c of said spacer and the top width e of said polysilicon pattern;

continuing etching to under cut said polysilicon pattern and remove a tail end of each spacer, and measuring the width d of said spacer after said tail end is removed; and determining the width of bottom under cut of said polysilicon pattern by computing the value of $e-2(c-d)$.

* * * * *